United States Patent [19]

Carsalade et al.

[11] Patent Number: 4,516,247
[45] Date of Patent: May 7, 1985

[54] SIGNAL RECEIVER WHICH INDICATES THE STATUS OF THE DEVICE CONNECTED THERETO

[75] Inventors: Henri Carsalade, Antibes; Francois-Xavier Delaporte, Cagnes-sur-Mer; Jean-Pierre Pantani, Nice, all of France

[73] Assignee: International Business Machines Corporation, Armonk, N.Y.

[21] Appl. No.: 496,328

[22] Filed: May 19, 1983

[30] Foreign Application Priority Data

Jul. 28, 1982 [EP] European Pat. Off. ........ 82430019.8

[51] Int. Cl.$^3$ ...................... H03K 5/153; H04L 25/06
[52] U.S. Cl. ........................................ 375/56; 307/356
[58] Field of Search ............... 307/350, 356, 360, 362; 375/76; 328/146, 147, 148; 340/825.06, 825.17

[56] References Cited

U.S. PATENT DOCUMENTS

| | | | |
|---|---|---|---|
| 3,509,279 | 4/1970 | Martin et al. | 375/76 |
| 3,708,784 | 1/1973 | Spencer | 340/825.17 |
| 3,845,401 | 10/1974 | Troiani et al. | 328/148 |
| 4,121,122 | 10/1978 | Pokrandt | 307/362 |
| 4,403,159 | 9/1983 | Goerne et al. | 307/360 |
| 4,410,858 | 10/1983 | Kusakabe | 307/362 |
| 4,418,290 | 11/1983 | Nagano | 307/362 |
| 4,424,457 | 1/1984 | Leuthold | 307/360 |

OTHER PUBLICATIONS

Electronic Design, 3/31/81, vol. 29, No. 7, R. Tenny, "Transistor Circuits Convert PIA Lines to RS-232 Ports & Vice-Versa", FIG. 2.

J. G. Graeme & G. E. Toby: "Operational Amplifiers", 1971, pp. 38-43, Chapter 1, para. 1.5, McGraw Hill, London; Differential Amplifier Stage Signal Characteristics, p. 41, lines 26-28.

IBM TDB, vol. 23, No. 4, Sep. 1980, pp. 1452-1453, Y. H. Chan et al., "Long Line Receiver". p. 1452, lines 10-11.

Primary Examiner—Benedict V. Safourek
Attorney, Agent, or Firm—Robert J. Haase

[57] ABSTRACT

A circuit for receiving signals from a device connected through a line meeting the requirements of EIA RS232C Standard, comprising a differential amplifier (2) receiving an input signal the amplitude of which is divided by factor k through input network (1). The switching threshold of amplifier (2) is variable and has a first value to ensure switching on the positive slope edge of the input signal and a second value to ensure switching on the negative slope edge. This circuit comprises circuits for detecting the status of the connected device, including a level detector (3) and a decision circuit (4) which, according to the outputs of the receiver and level detector (5), generates a signal indicating the status of the connected device. Integrators (5, 6) are provided for preventing the status indicating signal from changing its level when the input signal goes through zero or receives short noise pulses.

9 Claims, 6 Drawing Figures

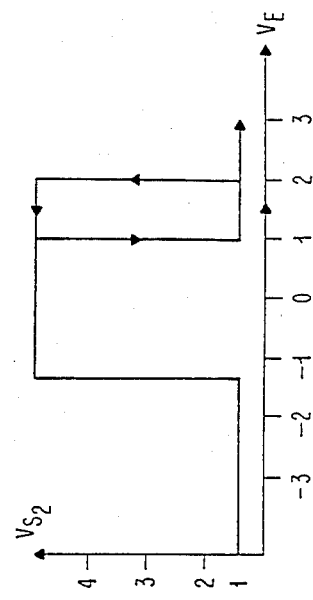
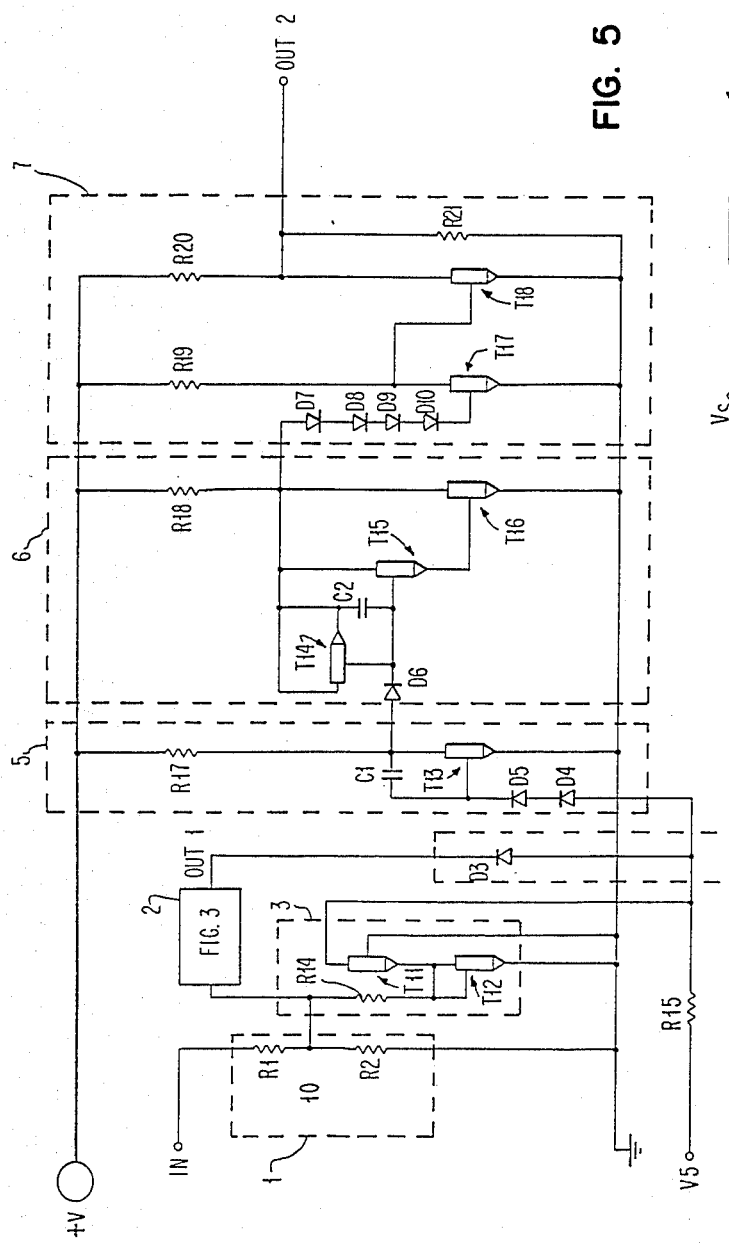
FIG. 5
FIG. 6

ND OF THE DEVICE CONNECTED
THERETO

DESCRIPTION

1. Technical Field

This invention relates to an electrical data signal receiver which can be used as an interface between a data communication equipment (DCE) and a data terminal equipment (DTE) and more particularly, to a receiver meeting the requirements of EIA RS 232C or CCIT V24 International Standards, which can be used in a receiving circuit comprising circuits indicating the status of the device to which the receiver is connected.

The EIA standards are provided for allowing the devices fabricated by various manufacturers in different countries to be interconnected. More particularly, EIA RS 232C standard is provided for determining the electrical characteristics of the signals exchanged between various data processing devices.

According to this standard, the binary signals to be sent on line by a line drive circuit or received from a line by a receiver, are different from the binary signals used within the machines and do not depend on any internal technology as the TTL, ECL, ..., etc. technologies. They are defined as follows:

(1) The levels: the positive range goes from +5 to +15 volts and the negative range from −5 to −15 volts. A forbidden range which comprises the 0 volt level lies between the positive and negative ranges of values.

(2) Input impedance R of the receiving device must be resistive and such that $3\ k\Omega \leq R \leq 7\ k\Omega$.

(3) The slope must be monitored, the line voltage when switching between the up status and the low status, must vary at a rate well defined between very accurate minimum and maximum values to permit a sufficiently high signal rate while avoiding the well known cross-talk phenomena which would be produced by edges showing a too steep slope.

2. Background Art

European Patent Application No. 80106634.1 filed on Oct. 20, 1980 and published on June 10, 1981 under number 0 029 919, describes a drive circuit generating binary signals meeting the requirements of EIA RS 232C standard.

There are receivers which meets the requirements of EIA RS 232C standard, in particular the receiver designed by Texas Instrument and described in Bulletin DLS 7011389, November 1970, pages 8.79 to 8.81.

Such a circuit is of the type comprising an input transistor operating in a switching mode and does not comprise any means for determining the status of the device sending the signals thereto.

DISCLOSURE OF INVENTION

Therefore, it is an object of the invention to provide a receiver meeting the requirements of EIA RS 232C standard, and a receiving circuit comprising means for detecting the power-on or the power-off status of the device sending the signals thereto.

Another object of the invention is to provide such a receiving circuit in which the dissipated power is very low.

Another object of the invention is to provide such a receiving circuit with a very good noise immunity.

The monolithic integrated receiver of the invention is intended to receive at its input the signals of a line meeting the requirements of EIA RS 232C standard and to provide at its output binary signals usable in data processing devices. The receiver comprises an input network receiving the line signal through its input and outputting a signal the amplitude of which is divided by factor k, threshold voltage generating means for generating first and second threshold voltages and a differential amplifier provided with two inputs: the first one receiving the output signal from the input network and the second one receiving the threshold voltages.

The differential amplifier comprises a first transistor the emitter of which is connected through a current source T3 to a first supply voltage, the collector is connected to a second supply voltage and the base is connected to the output of the input network, a second transistor the emitter of which is connected through the same current source as the first transistor, to the first supply voltage, the collector is connected to a third supply voltage, the collector is connected to a third supply voltage through a current sink, the base receives the threshold voltages, and an output transistor the collector of which is connected through a resistor to the first supply voltage and to the receiver output.

The threshold voltages are generated by two resistors arranged in series between the first and third supply voltages, and a diode connected transistor, the collector and base of which are connected to the common node of the resistors and the emitter is connected to the collector of the output transistor. The common node of the resistor and the emitter is connected to the collector of the output transistor. The common node of the resistors at which the threshold voltages are generated, is connected to the base of the second transistor of the differential amplifier.

This invention also relates to the use of the receiver in a receiving circuit comprising status detecting circuits provided with two inputs and one output, one of the inputs receiving the output signal from the receiver and the second input receiving the output signal from the input network for outputting a signal indicative of the status of the connected device sending the signals on line.

The status detecting circuits comprise a level detector providing a first information when the input voltage is close to zero volt or exceeds the switching threshold of the differential amplifier and a second information when the input voltage is lower than this threshold and a logic decision circuit which, according to the information provided by the level detector and the receiver output, generates a signal at a first level indicating that the connected device is off when the level detector provides the first information and the level of the receiver output is high and a signal at a second level indicating that the connected device is on when the status detector provides the second information and the level of the receiver output is high or when the level detector provides the first information and the level of the receiver output is low.

The status detecting circuits further comprise protective means, one of said means preventing the status indicating signal, generated at the output thereof from the signals provided by the logic decision circuit, from changing its level when, the connected device being on, the input signal of the receiver crosses the zero level when the input signal switches from high to low and conversely. The other protective means avoids the same trouble when, the connected device being off, very short spurious pulses interface with the input signal.

BRIEF DESCRIPTION OF THE DRAWINGS

FIG. 5 is a detailed diagram of the receiving circuit comprising the receiver of FIG. 3 and the status detecting circuits.

FIG. 6 illustrates the output voltage of the status detecting circuit in function of the receiver input voltage.

DETAILED DESCRIPTION OF THE INVENTION

Figure 1:
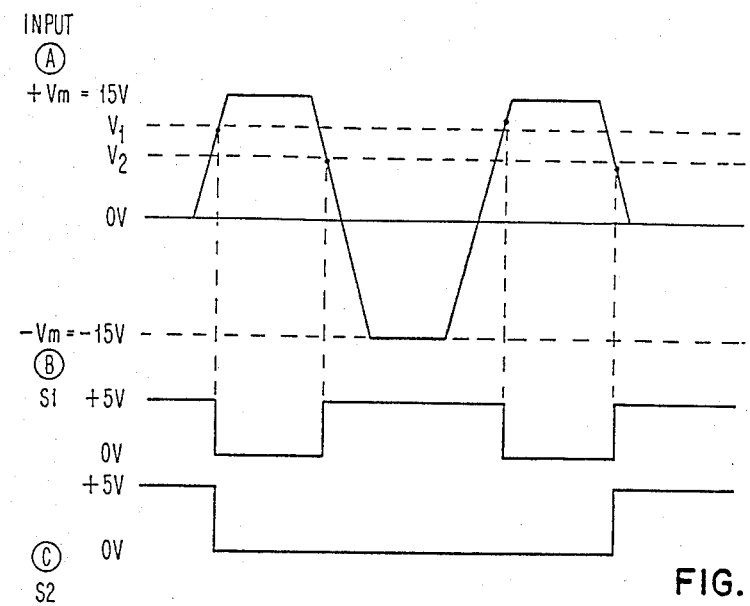
FIG. 1 schematically shows the input signals received by the receiver and the output signals of the receiver and status detecting circuits.

FIG. 1 schematically shows the receiver input signal received from the line connecting data terminal equipment (DTE) and data communication equipment (DCE) as well as the output signal delivered by the receiver. Input signal A has a level varying between $+V_m = +15$ volts and $-V_m = -15$ volts. Two detecting thresholds are provided: V1 on the positive slope edge and V2 on the negative slope edge. The receiver provides at its output S1, a square signal B the low level of which is 0 volt and the high level, +5 volts.

In fact, input signal A is at zero volt only when the device connected to the line and sending the signal to the receiver, is off. Consequently, this status cannot be detected by the receiver, and according to the invention, it is detected by particular circuits generating signal C.

Figure 2:
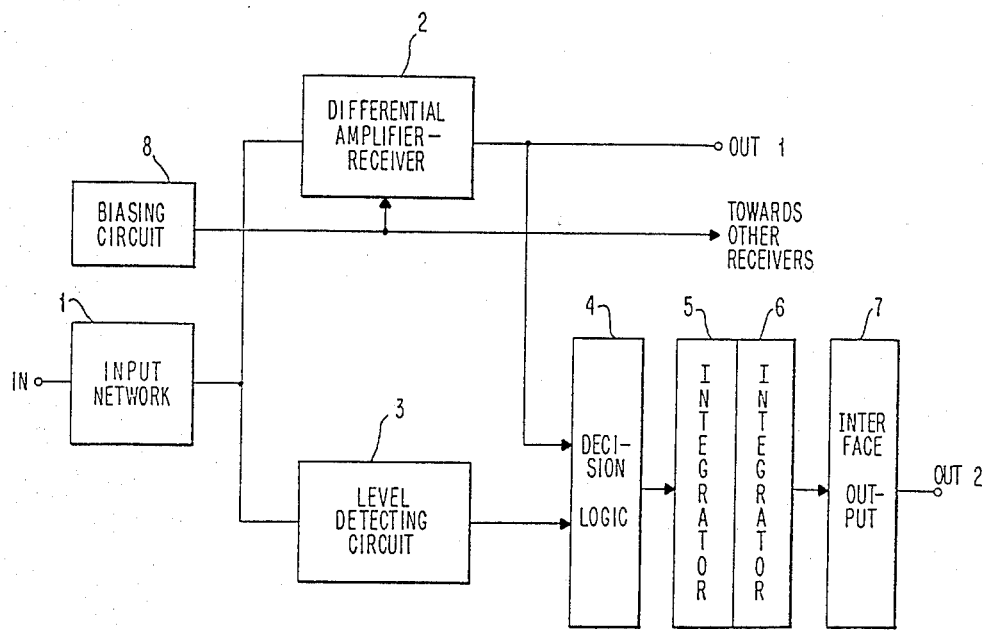
FIG. 2 is a block diagram of the receiving circuit.

FIG. 2 is a schematic diagram of the receiving circuit of the invention. It comprises an input network 1 receiving signal A of FIG. 1 at input terminal IN and a differential amplifier-receiver 2 which receives the output signal of input network 1 and which provides signal B of FIG. 1 at its output terminal OUT 1.

The receiving circuit further comprises circuits for detecting the status of the device connected to input IN. These circuits comprise a level detecting circuit 3 which receives the output signal of input network 1, and a logic decision circuit 4 which receives the output of differential amplifier-receiver 2 at one of its inputs and the output of level detector 3 through its other input.

The output of circuit 4 is applied to two protective circuits 5 and 6. An output interface circuit 7 connected to the output of the protective circuits provides the indication of the status of the device connected to terminal IN, at output terminal OUT 2.

A biasing circuit 8 which can be common to several receiving devices provides to differential amplifier 2, the biasing voltages required for the operation thereof.

In a preferred embodiment, decision circuit 4 provides an output signal at low level when the input signal on terminal IN is active, i.e., between 3 volts and 15 volts in absolute value, which means that the connected device is on. Otherwise, its output signal is high and the signal at OUT 2 is high.

The function of protective circuits 5 is to render status detection unaffected by the noise on the line, i.e., a pulse on the line of sufficient duration is required to indicate that the connected device is on. In addition, each time signal A crosses 0 level, it must not be indicated that the connected device is off. Protective circuit 6 allows proper indication to be provided only when signal A remains at 0 for a sufficient time.

Figure 3:
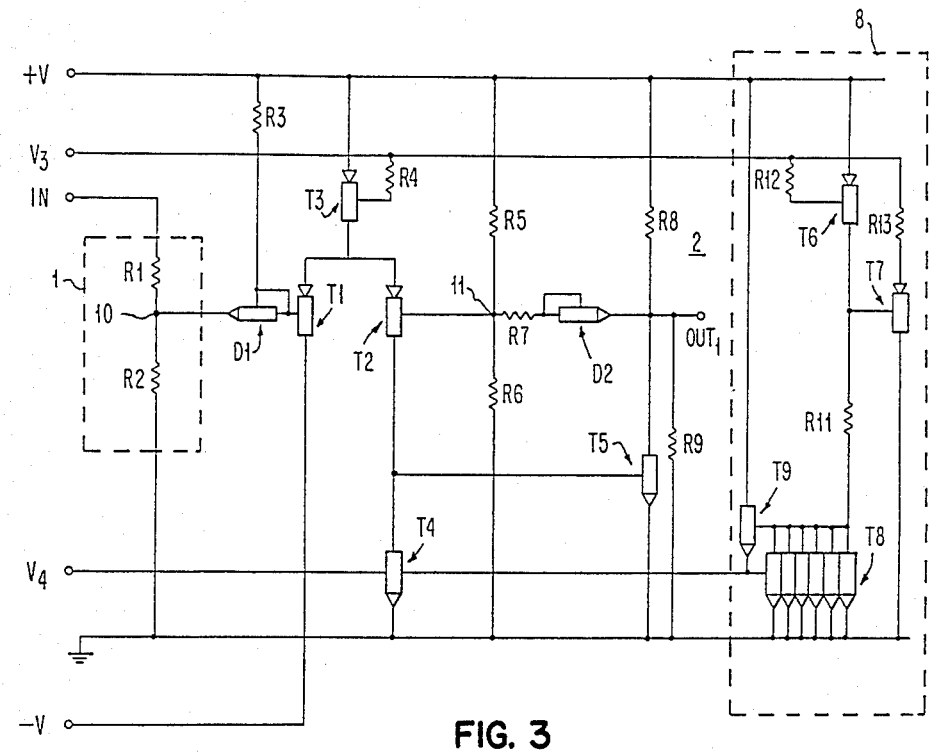
FIG. 3 is a detailed diagram of the receiver of the invention.

FIG. 3 illustrates input network 1, receiving differential amplifier 2 and biasing circuit 8.

Input network 1 comprises two resistors R1 and R2 of equal value in a preferred embodiment and arranged in series between input IN and the ground. The signal which will be applied to the receiver, is taken from common node 10 of the resistors. Consequently, the excursion of the input voltage of receiver 2 is divided by factor k approximately defined by the ratio of resistors R1 and R2 and equal to 2, in a preferred embodiment.

Circuit 2 includes a differential amplifier comprised of transistors T1 and T2. The input voltage divided by 2 at node 10, is applied to the base of T1 through diode-connected transistor D1. The emitter of D1 is connected to node 10 and its interconnected base and collector are connected, on the one hand, to the base of T1 and, on the other hand, to supply voltage +V through a resistor R3. The collector of transistors T1 is connected to supply voltage −V.

The emitters of transistors T1 and T2 are interconnected and their common node is connected to supply voltage +V through a current source comprising transistor T3. The collector of transistor T3 is connected to the emitters of transistors T1 and T2, its emitter is connected to voltage +V and its base is connected to biasing voltage V3 through a resistor R4.

The collector of transistor T2 is connected to the collector of transistor T4, the base of which receives biasing voltage V4 and the emitter is connected to the ground.

The base of transistor T2 is connected to common node 11 of two resistors R5 and R6 arranged in series between supply voltage +V and the ground.

Node 11 is connected through a resistor R7 to the common node of the base and collector of a diode-connected transistor D2 the emitter of which is connected to output OUT 1.

A resistor R8 is provided between voltage +V and output OUT 1 and a resistor R9 is provided between OUT 1 and the ground. The collector of an output transistor T5 is connected to OUT 1, the emitter is connected to the ground and the base is connected to the collector of T2.

Biasing circuit 8 provides biasing voltages V3 and V4. It comprises a biasing resistor R11 and a first current mirror circuit comprised of transistors T6 and T7 in which T6 is matched with current source T3. The emitter of transistor T6 is connected to voltage +V, its base is connected to a terminal of resistor R12, its collector is connected to a terminal of resistor R11 and to the base of transistor T7. The emitter of transistor T7 is connected to a terminal of resistor R13 and its collector is connected to the ground. The other terminals of resistors R12 and R13 are interconnected and voltage V3 is taken at their common node.

The biasing circuit includes another divider current mirror comprised of a transistor T9 and of n transistors T8 mounted in parallel, their collectors being connected to resistor R11, their emitters connected to the ground and their base connected to the emitter of transistor T9. In the preferred embodiment, n=6. The base of T9 is connected to the collectors of transistors T8 and its collector is connected to voltage +V. The bases of transistors T8 at which biasing voltage V4 is generated, are connected to the base of transistor T4 of the receiver. Current mirror T9-T8 divides current in R11 into 6 equal currents, each one of which flowing through one of 6 transistors T8.

The first current mirror determines the collector current of current generator T3, the second current mirror determines the current in current sink T4.

In the preferred embodiment, transistors T1, T2, T6 and T7 are of the PNP type, and transistors D1, D2, T4, T5, T8, T9 are of the NPN type. The resistors have the following values:

R1=R2=2, 17 kΩ
R3=50 kΩ
R4=R12=0.45 kΩ
R5=22.7 kΩ
R6=6.5 kΩ
R7=6.5 kΩ
R8=9.75 kΩ
R9=13 kΩ
R11=15 kΩ.

Supply voltages +V and −V are of +8.5 volts and −8.5 volts, respectively.

The receiver operates as follows: when the voltage at the base of T1 becomes more positive than the voltage at the base of T2, transistor T1 is off and transistor T2 is on, which causes output transistor T5 to conduct. On the contrary, when the voltage at the base of T1 becomes more negative than the voltage at the base of T2, T1 becomes conducting and T2 and T5 are off.

When T5 is off, the voltage at the base of transistor T2 is set at a first threshold value VTH1 by resistors R5 and R6. When voltage +V is of 8.5 volts, this value is equal to 1.88 volts. When transistor T5 is conducting, diode D2 is forward biased so that a current goes through resistor R7, which decreases the voltage at the base of the transistor T2 to a second threshold value VTH2 equal 1.38 volts in the preferred embodiment.

Therefore, this provides a hysteresis of about 0.5 volt on the signal issued from output 10 of the attenuator, which corresponds to 1 volt on the signal applied to input IN.

When no signal is applied to the input, T1 is ON, T5 and T2 are off and the signal issued from output OUT 1 is at a high level which is determined by voltage +V, and which is established at about 5 volts when +V is equal to 8.5 volts.

At this time, the threshold across the base of T2 is equal to VTH1, i.e., 1.88 volts.

When the connected device is powered on and provides a signal to input IN, the threshold remains set at VTH1 and when the input voltage at the base of T1 exceeds VTH1, T1 is off and T2 and T5 are on. Therefore, the signal form output OUT 1 goeds low, i.e., to about 0 volt and the threshold at the base of T2 is set at VTH2.

When the signal level at the base of T1 becomes less than threshold VTH2, T1 is on and T2 is off as well as T5, the level of the output signal becomes high. The threshold at the base of T2 becomes again equal to VTH1.

Input diode D1 shifts the voltage at terminal 10, applied to the base of transistor T1, to cause the receiver to switch when the input signal across terminal IN is less than +3 volts, in accordance with the requirements of EIA RS 232C standard. If there is no diode, the receiver switches when the input signal exceeds 2VTH1, i.e., 3.76 volts on the positive slope edge and 2VTH2, i.e., 2.76 volts on the negative slope edge.

Transistor T3 is a current generator for transistors T1 and T2, and it provides a current equal to the one of transistor T6 of the biasing circuit current mirror, which is equal to current IR11 flowing through resistor R11.

Transistor T4 is a current sink provided for draining current from transistor T2 when it is switched off and for accelerating the switching off of transistor T5.

The collector current of transistor T4 is equal to 1/6th of the current through resistor R11, which is due to the parallel arrangement of the 6 transistors T8. This feature prevents the collector current from not being entirely drained from transistor T2 when said transistor T2 is conducting and provides T5 with a base current equal to the 5/6th of the collector current of T2, in order to cause T5 to conduct.

Resistors R8 and R9 are provided for setting the level at terminal OUT 1 to a value compatible with the input characteristics of the circuit which will process the received signal.

Figure 4:
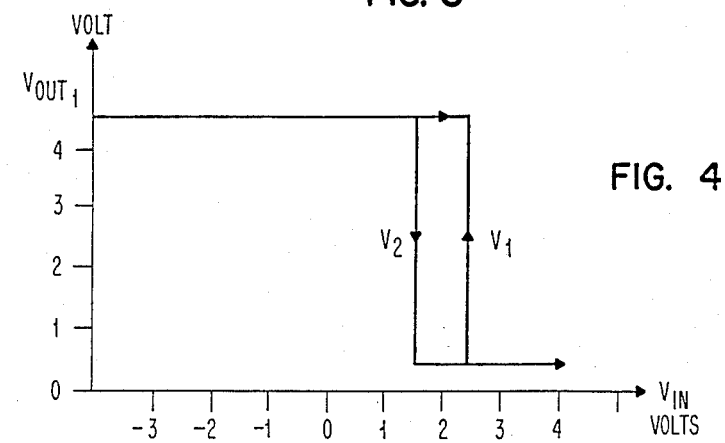
FIG. 4 represents the receiver output voltage in function of the receiver input voltage.

FIG. 4 illustrates the level of the output signal on terminal OUT 1 according to the level of the input signal on terminal IN.

The input hysteresis protects the receiver against continuous noise.

In the preferred embodiment, the input impedance is of 4.34 kΩ±15%. Consequently, it is conveniently possible to add a resistor/capacitor network to the receiver input to render the receiver even more insensitive to noise while maintaining an input impedance within the range recommended by EIA RS 232C standard, namely an input impedance of 3 to 7 kΩ.

The operation of the device provided for detecting the status of the device connected to input IN will be described in the following with reference to FIG. 5. Circuits 1 and 2 are the ones of FIG. 3 and circuits 3 to 7 of FIG. 2 are referenced on this figure.

Level detecting circuit 3 comprises a resistor R14 a terminal of which is connected to node 10 of input network 1 and the other terminal is connected to the emitter of a transistor T11. The collector of T11 is connected to positive voltage V5 through a resistor R15 and its base is connected to the ground. The collector of a diode-connected transistor T12 is connected to the emitter of T11 and its emitter is connected to the ground.

Logic decision circuit 4 is comprised of a diode D3 the cathode of which is connected to output OUT 1 of the receiver and the anode is connected to the collector of transistor T11.

Protective integrator 5 comprises two series-connected diodes D4 and D5, the anode of D4 is connected to the output of circuit 4 taken at the anode of D3. The cathode of D5 is connected to the base of a transistor T13. The collector of T13 is connected to voltage +V through a resistor R17, its emitter is connected to the ground. A capacitor C1 connects the collector and the base of T13.

Protective integrator 6 comprises a diode D6 the anode of which is connected to the collector of transistor T13 and the cathode is connected to the base of transistor T14.

The collector and emitter of T14 are connected to a terminal of capacitor C2 the other terminal of which is connected to the bases of transistor T14 and transistor T15. The T14 and C2 assembly is an integrating capacitor. The collector of T15 is connected to the collector of a transistor T16 and its emitter is connected to the base of T16, the collector of T16 is connected to voltage +V through a resistor R18, transistors T15 and T16 forming a Darlington circuit.

The output interface comprises four diodes D7 to D10 mounted in series and two transistors T17 and T18. The anode of D7 is connected to the output of integrator 6 taken at the collector of T16 and the cathode of D10 is connected to the base of T17, the emitter of T17 is connected to the ground and its collector is connected to voltage +V through a resistor R19 and to the base of T18. The collector of T18 is connected to voltage +V through resistor R20 and its emitter is connected to the ground. The collector of T18 is connected to the ground through resistor R21.

Output OUT 2 is taken from the collector of T18.

In a preferred embodiment, all the transistors of this circuit are of the NPN type.

Voltage V5 is of +3 volts.

The resistors have the following values:

R14≃20 kΩ
R15≃60 kΩ
R17≃40 kΩ
R18=108 kΩ
R19=20 kΩ
R20=8 kΩ
R21=10 kΩ.

The status detecting circuit operates as follows:

The signal at node 10 is applied to the emitter of T11 through injection resistor R14. If this signal is close to 0 volt, i.e., 0±0.6 volt, transistor T11 is off. Consequently, the current provided by resistor R15 is injected into the base of T13 by diodes D4 and D5 since, in this case, the level at terminal OUT 1 is high and diode D3 is off. Transistor T13 is saturated. Transistors T15 and T16 are off, transistor T17 is on and transistor T18 is off. Therefore, the level at OUT 2 is high, which indicates that the device connected to IN is off.

If the signal at node 10 does not exceed −1.5 volts, which corresponds to an input signal of −3 volts, transistor T11 is on and allows the current to flow from R15 to the ground. In this case, OUT 1 is always high and diode D3 is off. Transistor T13 is off. Transistors T15 and T16 are on. Transistor T17 is off and therefore, T18 is on. The signal issued from output OUT 2 is low, which indicates that the device connected to IN is on.

If the signal at input IN exceeds 3 volts, T11 is off and output OUT 1 of receiver 3 is low, therefore, diode D3 is on.

This diode will divert current from resistor R15 to the ground. In the same way as above, transistor T13 is off, transistors T15 and T16 are on. Therefore, T17 is off and T18 is on. The level across output OUT 2 is low.

The function of diode connected transistor T12 provided in the emitter circuit of T11 is to limit the inverse voltage applied to the base/emitter junction of T11 when the signal applied to input IN has its maximum value of 15 volts.

Consequently, when the input signal is either more positive than +3 volts or more negative than −3 volts, the level at OUT 2 is low, which indicates that the device connected to IN is powered on. If the signal across terminal 10 is within ±0.6 V, which corresponds to an input signal within ±1.2 V, the level at OUT 2 is high, which indicates that the device connected to IN is powered off.

However, this last indication must not be obtained when the input signal E at IN crosses the zero level. It is necessary to avoid all the peaks which could appear in the output signal at OUT 2 when the input signal crosses zero. This function is ensured by diode D6, transistor T14 and capacitor C2.

If we assume that the input signal exceeds 3 volts, as previously indicated, T13 is off, diode D6 is forward biased and transistors T15 and T16 are on.

If the input signal comes back close to 0 volt, T13 is instantaneously switch on and diode D6 backward biased. For as short time, T15 and T16 continue to conduct due to the effect of capacitor C2 which has been charged through resistor R17. The capacitor provides the current required to maintain transistors T15 and T16 on.

Since the capacitor discharges, the voltage at the collectors of T15 and T16 increases slowly.

If in the meantime, the input signal goes to −3 volts, T13 is again off and diode D6 is forward biased before the voltage applied to the collector of transistors T15 and T16 is sufficiently high to change the status of circuit 7 and the output does not show any voltage peak.

On the contrary, if the input signal remains close to 0 volt, the capacitor comprised of C2 and T14 fully discharges and the voltage at the collector of T15 and T16, becomes sufficiently high (about +3.5 volts) and a high logic level appears at the output to switch transistor T17 on through diodes D7 and D10.

In addition, when OUT 2 indicates that the device connected to IN is powered off, this status must not be disturbed by a random noise pulse which could appear on the connecting line between communication equipment DCE and terminal equipment DTE.

This function is ensured by capacitor C1 connected between the base and collector of transistor T13.

If we assume that the input signal applied to IN is within ±1.2 volts, T13 is conducting.

If the input signal becomes either higher than +3 volts or lower than −3 volts, T13 is switched off in a very short time since the current of R15 will be drained either by T11 (VIN<−3 V) or by output OUT 1 (VIN>+3 V). Due to capacitor C1, the base of T13, in fact, remains provisionally powered and thus, T13 remains on.

If in the meantime, the input signal becomes close to zero volt, the base of T13 is again supplied by R15 and T13 is always maintained on. Thus, the output does not show any voltage peak.

On the contrary, if the signal remains for a long time higher than +3 volts or lower than −3 volts, T13 becomes saturated, transistors T15 and T16 are off, transistor T17 is on and transistor T18 is off. The level at OUT 2 is high and the circuit detects an activity on the connecting line.

One of the advantages of the device of this invention lies in fact that it can be easily integrated and embodied as a monolithic device.

An interface for connecting a DCE device such as a modem and a DTE terminal device comprises a set of drive circuits as described in the above cited European Patent Application and receiving circuits. The drive circuits generate the signal to be sent and the receivers receive the signals. In effect, for a DCE/DTE connection, there are several lines, namely the lines required for transmitting the data themselves and the associated control lines. For instance, on the modem input end, a drive circuit is required to send data to the terminal and also a receiver to receive data from the terminal. For each control line, either a receiver or a drive circuit is required according to the type of the control line, namely a drive circuit when the line is intended for providing a signal to the terminal and a receiver when the line is intended for receiving a signal from the terminal.

In a wafer provided in a ½ inch module, it is possible to integrate four drive circuits and four receivers to which a circuit for detecting the status of the connected device can be associated for instance.

The receiver thresholds are well defined, the dissipated power is very small.

While the invention has been particularly shown and described with reference to preferred embodiments thereof, it will be understood by those skilled in the art that various changes in form and detail may be made therein without departing from the spirit and scope of the invention.

What is claimed is:

1. A monolithic integrated receiver for receiving first signals of an input line and for providing at its output binary signals usable in data processing devices, characterized in that it includes:
   an input network receiving said first signals and outputting a signal the amplitude of which is divided by factor k,
   threshold voltage generating means for generating first and second threshold voltages at different times,
   a differential amplifier with two inputs, the first one receiving the output signal of the input network and the second one receiving the threshold voltages.

2. A receiver as set forth in claim 1, characterized in that:
   the differential amplifier includes:
   a first transistor the emitter of which is connected through a current source to a first supply voltage, the collector of which is connected to a second supply voltage and the base of which is connected to the output of said input network,
   a second transistor the emitter of which is connected through the same current source as said first transistor, to said first supply voltage and the collector of which is connected to a third supply voltage through a current sink and the base of which is connected to receive said threshold voltages,
   an output transistor the emitter of which is connected to said third supply voltage, the collector of which is connected through a resistor to said first supply voltage and to the output of said receiver, the base of which is connected to the collector of said second transistor, and
   the threshold generating means includes:
   two resistors mounted in series between said first and third supplied voltages and having a common node at which said threshold voltages are generated, and
   a diode-connected transistor having its collector and base connected to the common node of said resistors and its emitter connected to the collector of said output transistor.

3. A receiver as set forth in claim 2, characterized in that it includes a biasing circuit comprising:
   a first current mirror setting the current in said current source equal to a first value, and
   a second current mirror setting the current in said current sink equal to a second value.

4. A receiver as set forth in claims 2 or 3, characterized in that it includes a diode connected transistor for decreasing the switching threshold of said differential amplifier, said diode connected transistor having its collector and base connected to the base of said first transistor of said differential amplifier and its emitter connected to said output of said input network.

5. A monolithic integrated receiving circuit for receiving first signals of an input line and transforming said first signals into binary signals usable in data processing devices, characterized in that it includes:
   a receiver as set forth in claim 1, and
   status detecting circuits having two inputs and one output, one of the inputs receiving said binary signals and the other input receiving said output signal of said input network for generating at said output a signal for indicating the status of the connected device which sends the signals on said input line.

6. A receiving circuit as set forth in claim 5 characterized in that the status detecting circuits comprise:
   a level detector connected to receive said output signal of said input network, comprising:
   a first power supply resistor connected to said output of said input network, and
   a detecting transistor the emitter of which is connected to said output of said input network via said power supply resistor, the base is connected to said third supply voltage and the collector is connected through a second power supply resistor to a fourth supply voltage, said detecting transistor being in a first condition when the input voltage is close to or exceeds zero volt, and in a second condition when the input voltage is negative,
   a logic decision circuit comprising a diode having one of its electrodes connected to the collector of said detecting transistor and its other electrode connected to said output of said receiver, and providing on its output taken from the collector of said detecting transistor, a signal at a first level when said detecting transistor is in its first condition, and the signal at said output of said receiver is high, and at a second level when said detecting transistor is in its second condition and the signal at said output of said receiver is high or said detecting transistor is in its first condition and the signal at said output of said receiver is low.

7. A receiving circuit as set forth in claim 6, characterized in that it comprises protective means receiving the output signal of said logic decision circuit and preventing the signal at said output of said status detection circuit from changing its level when, the connected device being on, the input signal crosses the level 0 or when, the connected device being off, noise is generated on the line.

8. A receiving circuit as set forth in claim 7, characterized in that the protective means comprise:
   a first integrator comprising a transistor having its base connected to the output of said logic decision circuit, its collector connected through a resistor to said first supply voltage and a capacitor connected between the base and collector of said transistor, the transistor of said first integrator being in a first condition when the output signal of said logic decision circuit is at its second level and in a first condition when said output signal of said logic decision circuit is at it s first level, and
   a second integrator connected to the collector of the transistor of said first integrator, comprising energy storage means and first and second Darlington-connected transistors, the base of said first transistor being connected to the collector of the transistor and said first integrator through the energy storage means, the condition of said Darlington-connected transistors depending on the condition of the transistor of said first integrator.

9. A receiving circuit as set forth in claim 8 characterized in that the energy storage include:

a diode having an electrode connected to the collector of the transistor of said first integrator and having another electrode connected to the base of said first Darlington-connected transistor, a capacitor connected between the collector and the base of said first Darlington-connected transistor, and a transistor having its collector connected to its emitter and to the collector of said first Darlington-connected transistor and its base connected to the base of said first Darlington-connected transistor, the last-named diode being forward biased on when the transistor of said first integrating circuit is in its first condition for loading the capacitor so that the condition of said Darlington-connected transistors does not change when, the connected device being on, the input signal crosses the zero level.

* * * * *